United States Patent
Rosal et al.

(10) Patent No.: US 7,450,452 B2
(45) Date of Patent: Nov. 11, 2008

(54) METHOD TO IDENTIFY OR SCREEN VMIN DRIFT ON MEMORY CELLS DURING BURN-IN OR OPERATION

(75) Inventors: Juan A. Rosal, Plano, TX (US); Michael Allen Ball, Richardson, TX (US); Jayesh C. Raval, Richardson, TX (US); Anand T. Krishnan, Farmers Branch, TX (US)

(73) Assignee: Texas Instruments Incorporated, Dallas, TX (US)

( * ) Notice: Subject to any disclaimer, the term of this patent is extended or adjusted under 35 U.S.C. 154(b) by 33 days.

(21) Appl. No.: 11/767,182

(22) Filed: Jun. 22, 2007

(65) Prior Publication Data

US 2007/0297254 A1    Dec. 27, 2007

Related U.S. Application Data

(60) Provisional application No. 60/805,703, filed on Jun. 23, 2006, provisional application No. 60/805,696, filed on Jun. 23, 2006, provisional application No. 60/805,704, filed on Jun. 23, 2006.

(51) Int. Cl.
*G11C 11/00*    (2006.01)
(52) U.S. Cl. ...................... 365/201; 365/154; 365/225.7
(58) Field of Classification Search ................ 365/201, 365/154, 225.7
See application file for complete search history.

(56) References Cited

U.S. PATENT DOCUMENTS 5,706,232 A * 1/1998 McClure et al. ............. 365/201

* cited by examiner

*Primary Examiner*—Huan Hoang
(74) *Attorney, Agent, or Firm*—Wade J. Brady, III; Frederick J. Telecky, Jr (57) ABSTRACT

A method of manufacturing a semiconductor device includes providing an electrical connection to a well of a MOS transistor of a static random access memory (SRAM) cell. A predetermined voltage is applied to the well using the connection to cause a threshold voltage ($V_t$) of said transistor to change. The change is employed to identify a reliability characteristic of the semiconductor device. An SRAM parameter is altered to modify the reliability characteristic.

20 Claims, 5 Drawing Sheets

METHOD TO IDENTIFY OR SCREEN VMIN DRIFT ON MEMORY CELLS DURING BURN-IN OR OPERATION

CROSS-REFERENCE TO PROVISIONAL APPLICATION

This application claims the benefit of U.S. Provisional Application No. 60/805,703 entitled "METHODOLOGY TO IDENTIFY AND/OR SCREEN VMIN DRIFT ON MEMORY CELLS DURING BURN-IN AND/OR OPERATION" to Juan Antonio Rosal, et al. filed on 23 Jun. 2006, U.S. Provisional Application No. 60/805,696 entitled "END-OF-LIFE PERFORMANCE MEASUREMENT TECHNIQUE AT TIME ZERO THROUGH THE IMPLEMENTATION OF BACK-BIAS" to Juan Antonio Rosal, et al. filed on 23 Jun. 2006, and U.S. Provisional Application No. 60/805,704 entitled "METHODOLOGY TO IDENTIFY AND/OR SCREEN MARGINAL FOM MEMORY CELLS AT TIME ZERO" to Juan Antonio Roal, et al. filed on 23 Jun. 2006, which are commonly assigned with the present invention and incorporated herein by reference as if reproduced herein in its entirety.

TECHNICAL FIELD

The embodiments discussed herein are directed to semiconductor device manufacturing, and more specifically, to parametric testing of semiconductor devices.

BACKGROUND

Semiconductor manufacturers thoroughly test some integrated circuits before they are shipped to a customer. Testing may screen for basic functionality as well as compliance with operational specifications driven by customer requirements. SRAMs are an integral part of many semiconductor devices, and are included in the functional tests. An SRAM is composed of many bitcells arranged in blocks optimized for compactness and modular placement on the device. In turn, each bitcell contains a number of transistors.

With transistor and gate length scaling to 65 nm/45 nm nodes, ensuring SRAM stability over the product's lifetime has become increasingly difficult. Negative bias temperature instability (NBTI), defects, or other phenomena may be manifested as a transistor threshold voltage ($V_t$) change over time. Such changes may cause the minimum reliable operating voltage ($V_{min}$) of SRAM memory cells to drift, or to become too stable to change state when commanded, leading to device failure.

Manufacturers typically screen such failures by a burn-in procedure, in which the device is operated under conditions that accelerate physical mechanisms associated with the failure. When an SRAM fails during burn-in, the failure lowers product yield. Yield loss may result in higher costs to the manufacturer, but protects the customer from the failure. But the burn-in may fail to sufficiently accelerate some failure modes, which may lead to premature SRAM failure after installation by a customer. In these cases, the manufacturer risks liability and loss of customer good-will.

SUMMARY

In one embodiment of the invention, a method of manufacturing a semiconductor device is presented. The method includes providing an electrical connection to a well of a MOS transistor of a static random access memory (SRAM) cell. A predetermined voltage is applied to the well using the connection to cause a threshold voltage ($V_t$) of the transistor to change. A test value of a reliability characteristic of the semiconductor is characterized while applying the predetermined voltage. An SRAM parameter is altered in response to the characterizing to modify the reliability characteristic.

Another embodiment is a method of manufacturing a semiconductor device. The method includes providing an electrical connection to n-wells of pMOS load transistors in a plurality of bitcells of an SRAM. An operating bias of the n-wells is determined. A test value of a reliability characteristic of the SRAM is characterized while applying a voltage different from the operating bias to the n-wells simultaneously with applying an operating voltage to the bitcells. The test value is compared to a value of the reliability characteristic specified for an operational lifetime. A programmable connection in the SRAM is reconfigured to replace the bitcell with a redundant bitcell when the reliability characteristic fails to meet the specified characteristic.

BRIEF DESCRIPTION OF THE DRAWINGS

Reference is now made to the following descriptions taken in conjunction with the accompanying drawings, in which.

DETAILED DESCRIPTION

The following abbreviations are used throughout this discussion and are collectively provided here for convenient reference:
BL: Bit Line
$V_{DD}$: SRAM upper rail supply voltage
$V_{SS}$: SRAM lower rail supply voltage
$V_{bs}$: the potential between a transistor body and source.
$V_{gs}$: the potential between a transistor gate and source.
$V_{trip}$: the difference between $V_{DD}$ and the BL voltage at which the state of an SRAM bitcell changes state.
$V_t$, $V_{tsat}$: the magnitude of $V_{gs}$ at which a MOS transistor saturates.
$T_0$: the point in time at which manufacturing of a semiconductor device is complete, with the exception of electrical test, any repair process or packaging.

A MOS transistor may be described as having four terminals: source, drain, gate and body. In a typical SRAM bitcell, the body is held at an operating bias voltage with respect to the source during normal operation. Normal operation is when the SRAM is configured for routine, non-diagnostic operation with voltage values within ranges specified for such operation. In general, the bias voltage, $V_{bs}$, may be greater than, less than or equal to zero. In some cases, $V_{bs}$ may be specified as a preferred voltage range that includes a preferred value during normal operation. A $V_{bs}$ at the preferred value or within the preferred range is an operating $V_{bs}$. The operating $V_{bs}$ may be determined, e.g., by a circuit designer, and may include a range such as, e.g., ±5%.

PMOS load transistors of an SRAM bitcell have an operating threshold voltage ($V_t$) when the SRAM is configured for normal operation. The operating $V_{bs}$ may be set during normal operation to adjust $V_t$ to a value that results in desired operating characteristics of a transistor or group of transistors in the bitcell. In embodiments described herein, $V_{bs}$ may be set to a value other than the operating value advantageously to cause the pMOS load transistors to operate with a test $V_t$ different from the operating $V_t$. The bitcell may then be tested while configured in this manner to determine if the bitcell has an unacceptable probability of failing within an operational lifetime of a semiconductor device of which the SRAM is a part.

Figure 1:
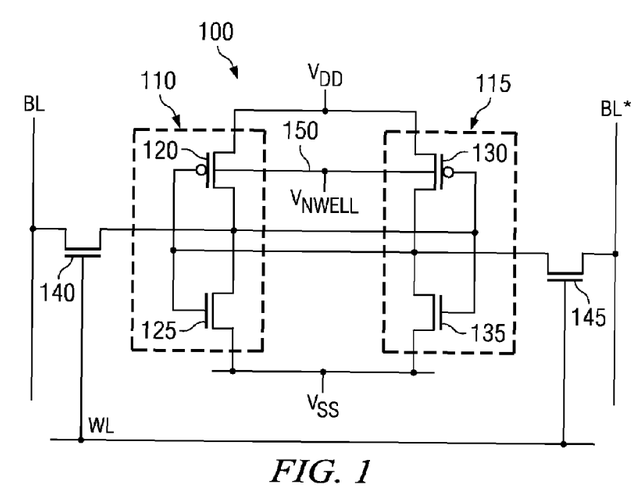
FIG. 1 illustrates an SRAM cell.

FIG. 1 illustrates a six transistor (6T) bitcell 100. The presentation of the 6T bitcell is for illustration of the principles discussed herein. Those skilled in the art will recognize that these principles may be applied to SRAM bitcells having a greater number of transistors, such as, e.g., an 8T bitcell. The bitcell 100 includes two cross-coupled inverters 110, 115. Together, the inverters 110, 115 form a latch of the bitcell 100. The inverter 110 includes a pMOS load transistor 120 and an nMOS driver transistor 125. The inverter 115 includes a pMOS load transistor 130 and an nMOS driver transistor 135. NMOS pass transistors 140, 145 are controlled by a word line (WL) to provide access by the bitlines (BL, BL*) to the internal nodes of the latch. An electrical connection 150 is provided to n-wells of the pMOS transistors 120, 130. The utility of the connection 150 is described in detail below.

The source terminals of the pMOS transistors 120, 130 are connected to an upper rail supply voltage, $V_{DD}$, and the drain terminals of the NMOS transistors 125, 135 are connected to a lower rail supply voltage, $V_{SS}$–$V_{DD}$–$V_{SS}$ may be a voltage difference at which the bitcell 100 is designed to operate. When $V_{SS}$ is ground, $V_{DD}$ is the design operating voltage. The design operating voltage in general depends on parameters such as the thickness and dielectric strength of the transistor gate dielectric. For example, in some cases transistors having a gate thickness of about 1.2 nm may operate with a design operating voltage of about 1.2 V. The design operating voltage may also be determined by a circuit designer and may include a range such as, e.g., +5%.

Being cross-coupled, the inverters 110, 115 are designed to equilibrate in one of two metastable states. The stability of these states depends on the relative strength of the pMOS transistors 120, 130, the nMOS transistors 125, 135, and the nMOS transistors 140, 145. The relative strength can drift from its designed value when the $V_t$ of the PMOS transistors 120, 130 changes. While any failure mode associated with a change of $V_t$ is within the scope of the invention, two particular modes of interest are provided as non-limiting examples that may present reliability concerns.

First, the stability of the bitcell 100 may be reduced by an increase of $V_t$ of the pMOS transistors 120, 130. When the $V_t$ of a transistor increases, the difference between a voltage applied to the gate and $V_t$ decreases, and the drive current of that transistor also decreases. These reductions lead to a reduction of the static noise margin (SNM) of the bitcell 100. When the SNM is too low, the state of the bitcell 100 may be upset by system electrical noise, e.g. Such an upset is referred to herein as a disturb fail.

Positive drift of $V_t$ of the pMOS transistors 120, 130 may result from degradation of the gate/channel interface after operation of the bitcell 100. One cause of such degradation is negative bias temperature instability (NBTI). NBTI is thought to be caused by an increase of the charge trap density at the interface between the gate dielectric and the channel of pMOS transistors during operation. Furthermore, NBTI is thought to be mediated by the presence of positive charge carriers (holes), so NBTI is specific to pMOS transistors. Thus, NBTI is expected to be manifested as a failure mode associated with an increase of the $V_t$ of the pMOS transistors 120, 130.

The second failure mode of interest is a failure of a commanded write to change the state of the bit cell 100. This failure is referred to as a write fail. Transistors have a statistical distribution of $V_t$ at $T_0$, so some transistors have a higher or lower $V_t$ relative to the population mean value. A bitcell having a "cooler" (higher $V_t$) nMOS transistor 125, 135 or a "hotter" (lower $V_t$) pMOS transistor 120, 130 may meet $T_0$ performance specifications, yet may have a greater probability of a write fail during the operational life if transistor $V_t$ values drift. The failure probability may increase due to, e.g., a change of resistance of a conductive path in a bitcell resistive path or leakage in a bitcell transistor. Such changes may cause a voltage imbalance between the inverters 110, 115 making the bitcell 100 too stable to change state when commanded.

Figure 2:
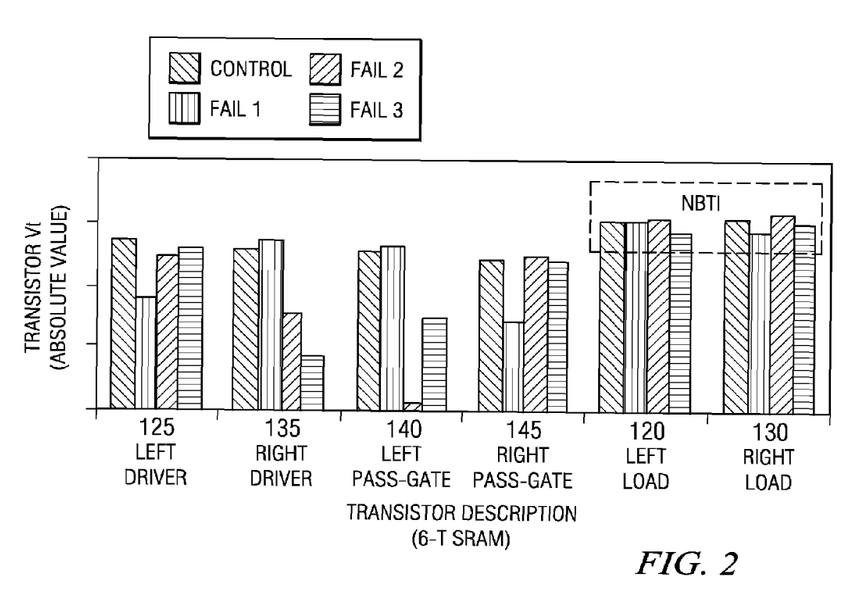
FIGS. 2-6 and 8 illustrate SRAM reliability characteristics.

FIG. 2 illustrates a bar graph of the experimentally determined $V_t$ of a control bit and bitcells failing due to marginal transistor $V_t$. The failing bits were identified as having a higher $V_{min}$ drift through burn-in, after which the $V_t$ of each transistor was measured by nano-probing. $V_{min}$ is the minimum supply voltage ($V_{DD}$ in FIG. 1) needed to ensure reliable operation of the bitcell 100. In each case, a large skew between the $V_t$ of nMOS driver transistors 125, 135 and NMOS pass-gate transistors 140, 145 is observed. This skew is thought to have made these cells prone to $V_{min}$ drift as the pMOS load transistors 120, 130 experienced NBTI shift during the burn-in period. The control bit has well balanced $V_t$ on the driver and pass-gate, and therefore did not experience as much $V_{min}$ drift as the failed bits. These data demonstrate that when the $V_t$ of the nMOS driver transistors 125, 135 and nMOS pass-gate transistors 140, 145 is unbalanced, the bitcell 100 may become detrimentally sensitive to $V_t$ drift of the pMOS load transistors 120, 130. The $V_t$ imbalance may be due to manufacturing variation or degradation effects, e.g., while the $V_t$ drift may be caused by, e.g., NBTI or other effects.

Figure 3:
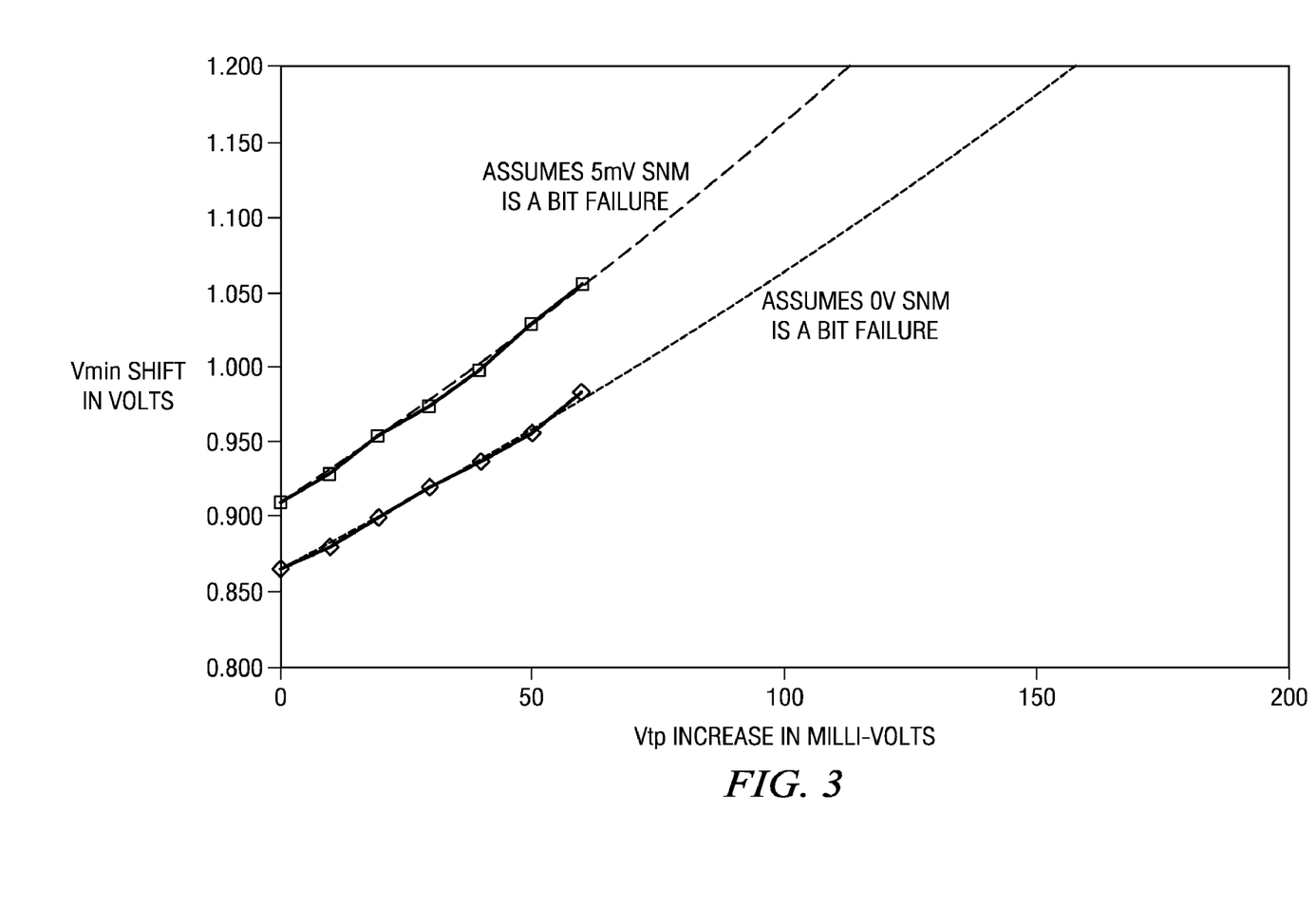

FIG. 3 illustrates the dependence of $V_{min}$ on the $V_t$ of a pMOS transistor. As the $V_t$ increases, the $V_{min}$ of the bitcell 100 increases due to the reduction of the SNM. Thus, as the $V_t$ increases from operation due to NBTI, the $V_{min}$ of the bitcell 100 may also increase, leading to unreliable operation thereof.

Figure 4:
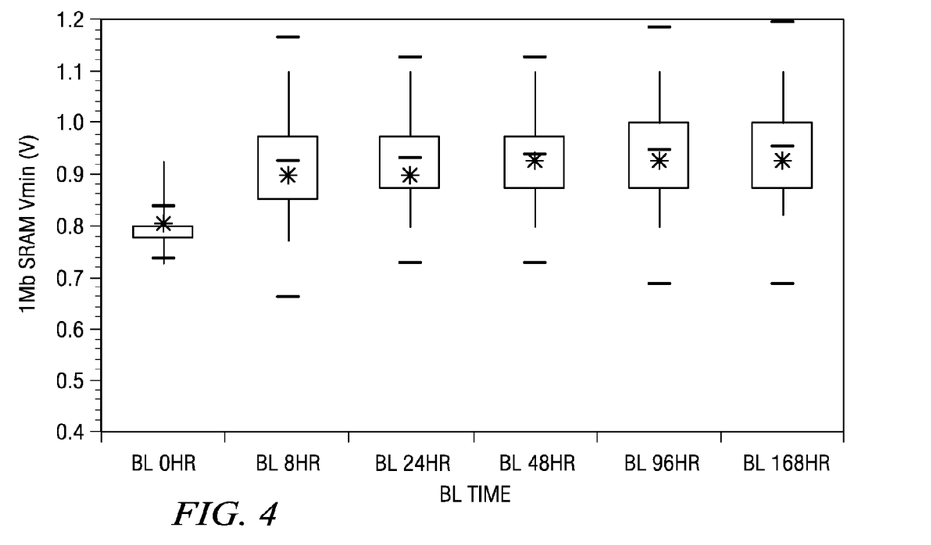

FIG. 4 illustrates the increase of $V_{min}$ of an SRAM as a function of burn-in time. The burn-in conditions were chosen to approximate changes expected in the operation of the SRAM from a longer period of operation under normal operating conditions. The increase is statistically significant, and under the burn-in conditions used, develops after 8 hours. Under these conditions, 8 hours represents only a portion of the operating lifetime of the SRAM. These data demonstrate that the NBTI effects may cause the SRAM $V_{min}$ to fall outside specified limits before a specified operating lifetime.

Figure 5:
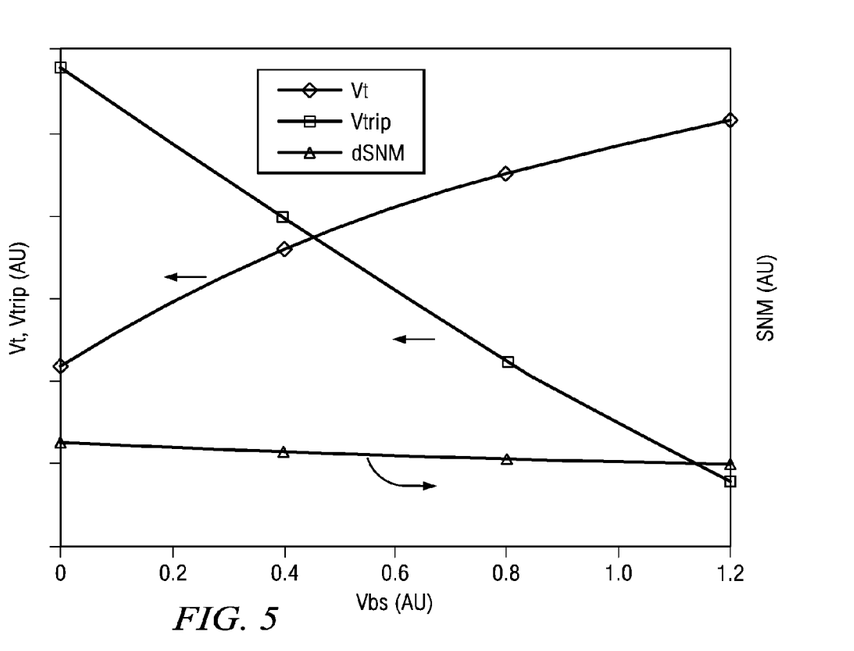

FIG. 5 illustrates the dependence of the $V_t$, $V_{trip}$ and SNM on $V_{bs}$ of a pMOS transistor representative of the pMOS transistors 120, 130. The $V_t$ increases smoothly and monotonically with increasing $V_{bs}$. Thus, $V_{bs}$ may be modulated to produce a desired $V_t$ change. As described below, this principle may be advantageously exploited to mimic the effect of NBTI on the bitcell 100 by raising $V_{bs}$ above the operating $V_{bs}$.

The trip voltage characterizes the ability to write a bit to the bitcell 100. $V_{trip}$ is typically described by the difference between the bitcell 100 $V_{DD}$ and the voltage to which the bitline BL must fall before the inverters 110, 115 change state. The $V_{trip}$ characteristic in FIG. 5 illustrates that the $V_{trip}$ decreases smoothly and monotonically as the $V_{bs}$ is increased. Thus, $V_{bs}$ may be modulated to produce a desired $V_{trip}$ change. This relationship may be advantageously exploited to mimic the effect of high-resistance paths in the bitcell 100 by lowering $V_{bs}$ below the operating bias.

FIG. 5 also illustrates the dependence of the SNM of the bitcell 100 on $V_{bs}$. The SNM decreases with increasing $V_t$, illustrating the previously described reliability issue associated with increasing $V_t$ of the pMOS transistors 120, 130 due to NBTI.

Figure 6:
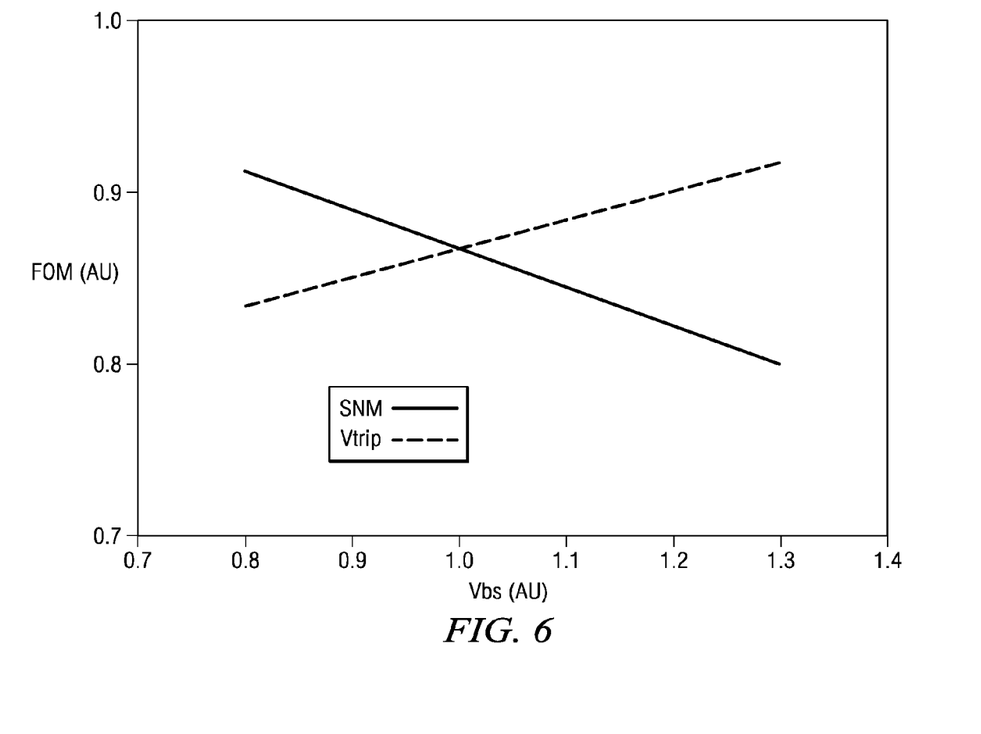

FIG. 6 illustrates the dependence of a yield figure of merit (FOM) of an SPAM containing the bitcell 100 on the $V_{bs}$ of the pMOS transistors 120, 130. The $V_{bs}$ and FOMs are expressed in arbitrary units. FOMs relating the SNM and the $V_{trip}$ to yield are shown. The significance of the SNM was described previously.

A higher $V_{trip}$ is associated with increased difficulty writing a bit to the bitcell 100. When $V_{trip}$ exceeds a maximum functional value, a write fail of the bitcell 100 may occur. The trip voltage may be degraded (increased) by higher $V_t$ of the nMOS driver transistors, lower $V_t$ of the pMOS load transistors, lower supply voltage or defects such as a high resistance contact. Thus, lowering the $V_t$ provides a means to cause a write fail in weak bitcells 100 to screen these bitcells 100 and remove them from the circuit.

The FOMs in FIG. 6 are a statistical prediction of the number of failing bits due to each respective failure mode. The probability of a bit fail caused by the respective failure mode increases exponentially as the FOM associated with that mode decreases. When $V_{bs}$ is less than unity (arbitrary units) in FIG. 6, a loss of yield of the SRAM is expected to be dominated by SRAM write fails. When $V_{bs}$ exceeds unity, a loss of yield of the SRAM is expected to be dominated by SRAM disturb fails.

As used herein, yield refers to the fraction of a population of devices that meet specified requirements of one or more functional electrical tests. Such tests may include, e.g., logic functionality, SRAM functionality, functionality as a function of clock speed, and functionality as a function of supply voltage. A yield may additionally describe the percentage of devices for which a tested subsystem, such as an SRAM, e.g., meets specified requirements.

An automated functional test program may include one or more tests designed to provide data that comprehensively characterize a device, and indicate if the device meets specified requirements. A functional test in some cases may include standard functional test patterns. Such test patterns are designed to rigorously and systematically test an SRAM block, and may include patterns such as, e.g., all 1's, all 0's, checkerboards and march patterns. Test patterns that conform to an industry standard or commonly used format, or substantially include elements thereof are within the scope of a standard functional test pattern. The SRAM may additionally be tested at different voltages to guarantee operation within a voltage range.

The inventors have recognized that the illustrated relationships between $V_{bs}$ and $V_t$, $V_{min}$, $V_{trip}$ and SNM may be advantageously exploited to screen bitcells 100 for bitcells that may not meet a specified reliability requirement. The $V_t$ may be increased with respect to the operating $V_t$ to screen for disturb fails, e.g. Alternatively or in combination, the $V_t$ may be decreased with respect to the operating $V_t$ to screen for write fails. Testing with the operating $V_t$, elevated $V_t$ or reduced $V_t$ may be performed in any combination or order within the scope of the invention.

If the probability of bitcell 100 failure is unacceptable, an SRAM parameter may be altered to modify a reliability characteristic. An SRAM parameter may be, e.g., a process parameter, an operating parameter such as a voltage, or a configuration of fuses. A process parameter may be any process, process-related variable or condition related to the formation of the SPAM. Non-limiting examples include process conditions related to any material removal or deposition process, photolithography process or thermal process.

As used herein, a reliability characteristic is any physical or electrical observable that may be used to characterize the reliability of a semiconductor device. In some cases, the reliability may be with respect to a period of time such a design lifetime or a guaranteed operating lifetime, such as, e.g., 10 years. Nonlimiting examples of reliability characteristics include SRAM yield, a maximum operating speed of a semiconductor device, or a failure signature resulting from a functional test.

In one aspect of the invention, an electrical connection, such as the connection 150, is provided to a well of a MOS transistor of an SRAM bitcell 100 to control $V_{bs}$ of that transistor. In one embodiment, the connection is provided to both comparable transistors of the bitcell 100. Comparable transistors are transistors of a same type and function in the bitcell 100, such as, e.g., both the PMOS transistors 120, 130 or both the nMOS transistors 125, 135. In some cases, the $V_{bs}$ may be applied by a test pad at the top interconnect level of the SRAM through an electrical contact to the well of the transistor.

An electrical connection is provided when an electrical potential is resistively coupled to the terminal of interest. Coupling may be made by the semiconductor manufacturer in-line in a semiconductor fabrication facility, off-line in a post fabrication test environment, or by a test facility or customer after the semiconductor device leaves the possession of the manufacturer.

In one aspect of the invention, $V_{bs}$ is set to a voltage different from the operating $V_{bs}$ while applying an operating voltage to the bitcell 100. In some cases, the operating voltage is the design operating voltage of the bitcell. A test value of a reliability characteristic, such as a yield, e.g., may be determined while the bitcell 100 is configured in this manner. The test value may then be compared to a predetermined value of the reliability characteristic. When the test value fails to meet a predetermined value of the reliability characteristic, an SRAM parameter may be varied to modify the reliability characteristic. The predetermined value may be, e.g., a specified performance driven by customer requirements. In some cases, the bitcell 100 may be replaced with a redundant bitcell 100 by reconfiguring programmable connections such as fuses in the SRAM.

In one embodiment, $V_{bs}$ is applied to the p-well of the nMOS transistors 125, 135 or the nMOS transistors 140, 145 to cause the respective $V_t$ to change in a manner that simulates nMOS transistor degradation. In another embodiment, $V_{bs}$ is applied to the n-well of the pMOS transistors 120, 130 to cause the $V_t$ to change in a manner that approximates a $V_t$ shift expected to result over the operational lifetime of the SRAM. In some cases, this $V_t$ shift is determined to approximate NBTI effects. In some embodiments, the $V_{bs}$ is set to a voltage to discriminate between write fails and disturb fails by increasing the probability of one failure type relative to the other. In some cases, $V_{bs}$ may be set at a voltage that results in a $V_t$ that is predicted to characterize a PMOS load transistor of the bitcell 100 after an operational period of interest. This period may be a period corresponding to a specified life of a semiconductor device of which the bitcell 100 is a part.

In another embodiment, a $V_{bs}$ is applied to cause the $V_t$ of the transistor to decrease below its $T_0$ value, and the yield of the SRAM is characterized. In this configuration, the pMOS transistors 120, 130 run hotter, increasing the trip voltage of the bitcell 100. Failures of bitcells under this condition may reflect a higher probability of a write failure of bitcell 100.

In another embodiment, $V_{bs}$ is set at a value that increases the $V_t$, and the devices of which the bitcells 100 are a part are tested for maximum operating speed. The maximum operating speed may be a speed specified as a minimum operating speed at the end of the specified life of the device.

In another embodiment, an SRAM may be tested using industry standard functional test patterns while the $V_{bs}$ is set at a value that causes $V_t$ to be greater or less than its operating value. Functional test results with $V_t$ both greater than and less than the operating value provide data for establishing a guard-band for $V_{DD}$. A guard-band is a range of $V_{DD}$ that includes the design operating voltage within which the SRAM is specified to operate without error. Determining the guard-band in this manner is advantageous because it provides the ability to do so without varying the design operating voltage during test. Thus, errors due to other effects of changed $V_{DD}$, such as logic failures, are avoided.

In one aspect of the invention, bitcells 100 that fail functional testing may be repaired. In another aspect, bitcells 100 that pass functional testing at $T_0$ but are determined to have a sufficiently high probability of failing within the anticipated lifetime of the SRAM may be repaired. In other cases, the device including the SRAM may be de-rated or discarded.

In another embodiment, one or more of the transistors 120, 125, 130, 135, 140, 145 are triple-well MOS transistors. Triple-well transistors may be n-well or p-well, and are designed to have improved isolation from the substrate in which they are formed for increased noise immunity.

Figure 7:
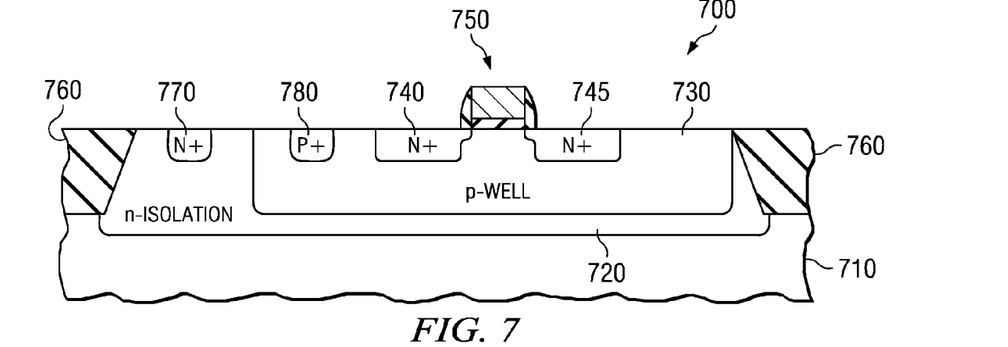
FIG. 7 illustrates a triple-well transistor.

FIG. 7 illustrates an nMOS triple well transistor 700 formed in a substrate 710 as a non-limiting example. An n-isolation well 720 is formed in the substrate 710, and a p-well 730 is formed within the n-isolation well 720. Source/drain regions 740, 745 are formed in the p-well 730, and a gate structure 750 is formed thereover. Dielectric isolation trenches 760 separate the transistor 700 from a neighboring transistor. An n+ contact well 770 provides an electrical connection to the n-isolation well 720, and a p+ contact well 780 provides an electrical connection to the p-well 730.

A voltage may be applied to the n-isolation well 720 to maintain isolation of the transistor 700 from the substrate 710. A predetermined voltage is applied to the p-well 730 with respect to the source 740 to cause the $V_t$ of the transistor 700 to increase or decrease with respect to a $T_0$ value. A reliability characteristic of a semiconductor device including the transistor 700 is determined using the method described herein. If the reliability characteristic falls outside an acceptable range, an SRAM parameter is altered to modify the reliability characteristic. In some cases, the SRAM parameter is a configuration of programmable fuses reconfigured to repair and an SRAM including the bitcell 100.

In an embodiment in which one of the pMOS transistors 120, 130 is a triple-well transistor, a bias voltage may be applied to the n-well of the transistor as previously described. A voltage may also be applied to a p-isolation well to maintain isolation of the pMOS triple-well transistor from the substrate.

Figure 8:
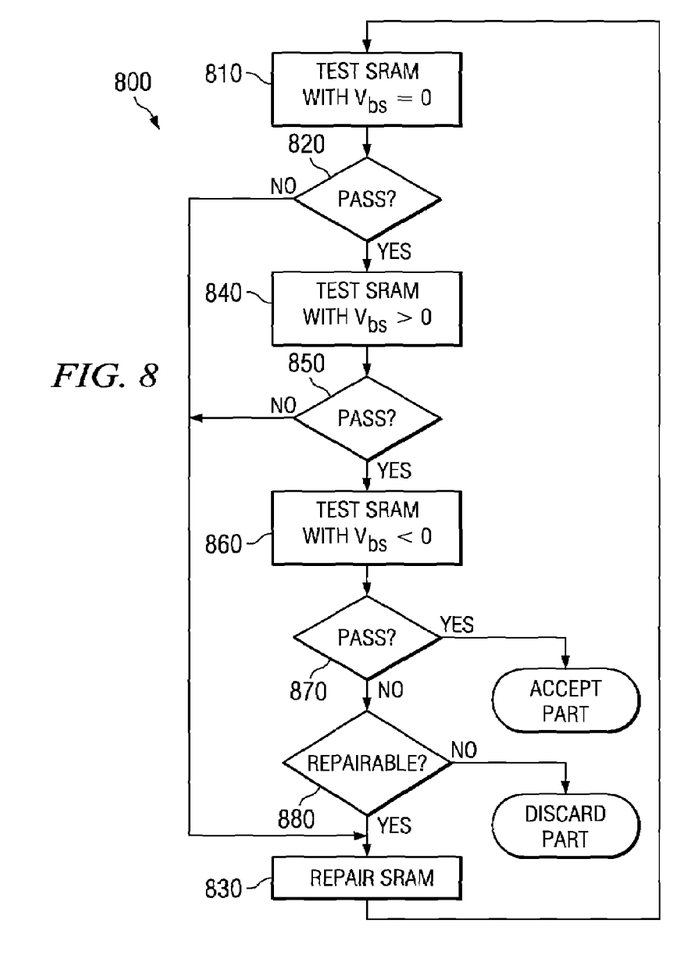

FIG. 8 illustrates a method 800 according to the invention. In a step 810, a parametric test system is used to administer a functional test of an SRAM including the bitcell 100. A non-limiting example of such a test system is the FLEX system manufactured by Teradyne, Inc, North Reading, Mass. In the step 810, the $V_{bs}$ of the pMOS transistors 120, 130 is set to about zero. In a step 820, a determination is made whether the SRAM passed the functional test. If the SRAM did not pass, the SRAM is repaired in a step 830 and retested. If the SRAM did pass the test with $V_{bs}$=0, then the SRAM is again tested in a step 840 with $V_{bs}$>0. In some cases, the $V_{bs}$ is set a voltage to approximate an end-of-life $V_t$ shift caused by NBTI.

In a nonlimiting example, an SRAM is designed to operate normally with $V_{DD}$≈1.2 V, and $V_{bs}$≈0. In this case, $V_{bs}$ may be set to about 0.6 V to mimic NBTI. In some cases, the SRAM may be designed to operate normally with a different $V_{DD}$ and/or a different $V_{bs}$. In such cases, the $V_{bs}$ may be determined that properly accounts for expected $V_t$ drift due to all anticipated effects.

In a step 850, a determination is made whether the SRAM passed the functional test with $V_{bs}$>0. If not, the SRAM is repaired in the step 830 and retested. If the SRAM did pass the test at $V_{bs}$>0, then the SRAM is again tested in a step 860 with $V_{bs}$<0. In some cases, the $V_{bs}$ is set to a voltage that that results in the probability of write fails exceeding the probability of disturb fails. In a nonlimiting example, for pMOS transistors 120, 130 having a $V_{DD}$ of about 1.2 V, the $V_{bs}$ is set to about −0.3 V. In a step 870, a determination is made whether the SRAM passed the functional test with $V_{bs}$<0. If so, the part is accepted. If not, a determination is made in a step 880 whether the SRAM is repairable given the history of testing and repair of the SRAM. If the SRAM is determined to be repairable, the SRAM is repaired in the step 830 and retested. If not, the SRAM is discarded. If the SRAM is accepted, the $V_{bs}$ may then be set to an operating bias determined to result in a predetermined $V_t$ of, e.g., pMOS transistors in bitcells of the SRAM.

Figure 9:
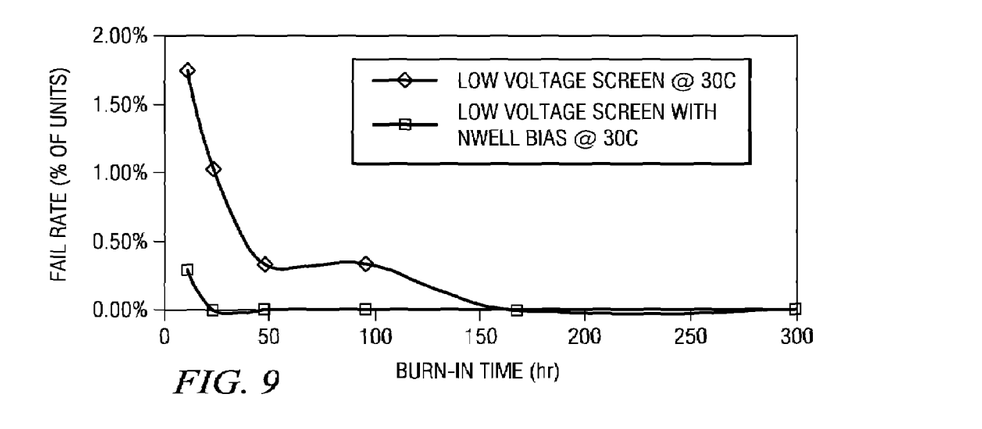
FIG. 9 illustrates a method.

FIG. 9 illustrates dependence of failure rate on burn-in time of a control group of semiconductor devices (top curve) and a group screened and repaired by the method 800 (bottom curve). Both groups were initially screened for low $V_{DD}$ functionality. One group (square symbols) was additionally screened for functionality with high and low $V_t$ as described above. The $V_t$-screened group shows a dramatically reduced burn-in failure rate. Reliability models predict a longer average lifetime of the screened group relative to the unscreened group. The longer lifetime reduces the exposure of the manufacture and the customer to risk due to early failure of the screened devices.

Those skilled in the art will appreciate that other and further additions, deletions, substitutions and modifications may be made to the described embodiments without departing from the scope the disclosure set forth herein.

What is claimed is:

1. A method of manufacturing a semiconductor device, comprising:
   providing an electrical connection to a well of a MOS transistor of a static random access memory (SRAM) cell;
   applying a predetermined voltage to said well using said connection to cause a threshold voltage ($V_t$) of said transistor to change;
   characterizing a test value of a reliability characteristic of said semiconductor device while applying said predetermined voltage; and
   altering an SRAM parameter in response to said characterizing to modify said reliability characteristic.

2. The method as recited in claim 1, wherein said reliability characteristic is a yield of said SRAM using a standard functional test pattern.

3. The method as recited in claim 1, wherein said reliability characteristic is a maximum operating speed of said semiconductor device.

4. The method as recited in claim 1, wherein said transistor is a pMOS transistor and said well is an n-well.

5. The method as recited in claim 4, wherein said $V_t$ is increased by said applying.

6. The method as recited in claim 5, wherein said predetermined voltage is chosen to approximate an end-of-life $V_t$ shift caused by negative temperature bias instability.

7. The method as recited in claim 1, wherein said reliability characteristic is a probability of a disturb failure of an SRAM bitcell.

8. The method as recited in claim 1, wherein said reliability characteristic is a probability of write failure of an SRAM bitcell.

9. The method as recited in claim 1, wherein said SRAM parameter is a configuration of programmable fuses.

10. The method as recited in claim 1, wherein said SRAM parameter is a guard-band of said bitcell.

11. The method as recited in claim 1, wherein said transistor is a triple-well transistor.

12. A method of manufacturing a semiconductor device, comprising:
    providing an electrical connection to n-wells of pMOS load transistors in a plurality of bitcells of a static random access memory (SRAM);
    determining an operating bias of said n-wells;
    characterizing a test value of a reliability characteristic of said SRAM while applying a voltage different from said operating bias to said n-wells simultaneously with applying an operating voltage to said bitcells;
    comparing said test value to a predetermined value of said reliability characteristic specified for an operational lifetime;
    reconfiguring a programmable connection in said SRAM to replace said bitcell with a redundant bitcell when said reliability characteristic fails to meet said specified characteristic.

13. The method as recited in claim 12, wherein a difference between said operating bias and said voltage produces a change of threshold voltage of said transistor corresponding to a predetermined change over said operational lifetime.

14. The method as recited in claim 13, wherein said predetermined change is a shift of threshold voltage caused by negative temperature bias instability.

15. The method as recited in claim 12, wherein said reliability characteristic is a yield of said SRAM when tested using a standard functional test pattern.

16. The method as recited in claim 12, wherein said transistor is a triple-well transistor.

17. The method as recited in claim 12, wherein said voltage is higher than said operating bias.

18. The method as recited in claim 17, wherein said higher voltage causes disturb fails to dominate failures of said bitcells.

19. The method as recited in claim 12, wherein said voltage is lower than said operating bias.

20. The method as recited in claim 19, wherein said lower voltage causes write fails to dominate failures of said bitcells.

* * * * *